United States Patent
Higuchi et al.

(10) Patent No.: US 8,946,750 B2
(45) Date of Patent: Feb. 3, 2015

(54) SEMICONDUCTOR LIGHT EMITTING DEVICE

(71) Applicant: Kabushiki Kaisha Toshiba, Tokyo (JP)

(72) Inventors: Kazuhito Higuchi, Kanagawa-ken (JP);
Hideo Shiozawa, Kanagawa-ken (JP);
Takayoshi Fujii, Kanagawa-ken (JP);
Akihiro Kojima, Kanagawa-ken (JP);
Susumu Obata, Kanagawa-ken (JP);
Toshiyuki Terada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 13/833,170

(22) Filed: Mar. 15, 2013

(65) Prior Publication Data

US 2013/0256727 A1    Oct. 3, 2013

(30) Foreign Application Priority Data

Mar. 30, 2012    (JP) .................................. 2012-080257

(51) Int. Cl.
| | |
|---|---|
| *H01L 33/00* | (2010.01) |
| *H01L 33/44* | (2010.01) |
| *H01L 33/50* | (2010.01) |
| *H01L 33/46* | (2010.01) |

(52) U.S. Cl.
CPC ................ *H01L 33/44* (2013.01); *H01L 33/50* (2013.01); *H01L 33/46* (2013.01)
USPC .................................. 257/98; 257/99; 438/29

(58) Field of Classification Search
CPC ................................. H01L 33/44; H01L 33/00
USPC ........................................ 257/98–99; 438/29
See application file for complete search history.

(56) References Cited

U.S. PATENT DOCUMENTS

| 2010/0081220 A1* | 4/2010 | Cheng et al. ..................... 438/27 |
| 2010/0140640 A1 | 6/2010 | Shimokawa et al. |
| 2010/0200886 A1* | 8/2010 | Krames et al. .................. 257/98 |

FOREIGN PATENT DOCUMENTS

| JP | 2004-96113 | 3/2004 |
| JP | 2008-541411 | 11/2008 |
| JP | 2010-508669 | 3/2010 |
| JP | 2010-130526 | 6/2010 |
| JP | 2011-258658 | 12/2011 |
| JP | 2012-19201 A | 1/2012 |
| WO | 2009/019836 A2 | 2/2009 |

OTHER PUBLICATIONS

U.S. Appl. No. 14/026,178, filed Sep. 13, 2013, Kimura et al.
Office Action issued Jul. 11, 2014 in Japanese Patent Application No. 2012-080257 (with English language translation).
Japanese Office Action issued Jan. 17, 2014, in Japan patent application No. 2012-080257 (with English translation).
U.S. Appl. No. 13/826,935, filed Mar. 14, 2013, Obata, et al.
U.S. Appl. No. 13/826,509, filed Mar. 14, 2013, Kimura et al.

* cited by examiner

*Primary Examiner* — Theresa T Doan
(74) *Attorney, Agent, or Firm* — Oblon, Spivak, McClelland, Maier & Neustadt, L.L.P.

(57) ABSTRACT

A semiconductor light emitting device includes a light emitting unit, a first and second conductive pillar, a sealing unit, a translucent layer, and a wavelength conversion layer. The light emitting unit includes a first and second semiconductor layer and a light emitting layer. The first semiconductor layer has a first and second major surface. The first major surface has a first and second portion. The second major surface is opposed the first major surface and has a third and fourth portion. The light emitting layer is provided on the first portion. The second semiconductor layer is provided on the light emitting layer. The first conductive pillar is provided on the second portion. The second conductive pillar is provided on the second semiconductor layer. The translucent layer is provided on the fourth portion. The wavelength conversion layer is provided on the third portion and on the translucent layer.

20 Claims, 9 Drawing Sheets

SEMICONDUCTOR LIGHT EMITTING DEVICE

CROSS-REFERENCE TO RELATED APPLICATIONS

This application is based upon and claims the benefit of priority from the prior Japanese Patent Application No. 2012-080257, filed on Mar. 30, 2012; the entire contents of which are incorporated herein by reference.

FIELD

Embodiments described herein relate generally to a semiconductor light emitting device.

BACKGROUND

Semiconductor light emitting devices such as light emitting diodes (LEDs) have been developed using a nitride semiconductor. Also, semiconductor light emitting devices that emit white light have also been developed, for example, by combining an LED that emits blue light with a phosphor that absorbs blue light and emits yellow light.

With this type of semiconductor light emitting device, the chromaticity changes depending on the angle that the light is emitted (hereinafter referred to as chromaticity deviation).

DETAILED DESCRIPTION

Figure 1A:
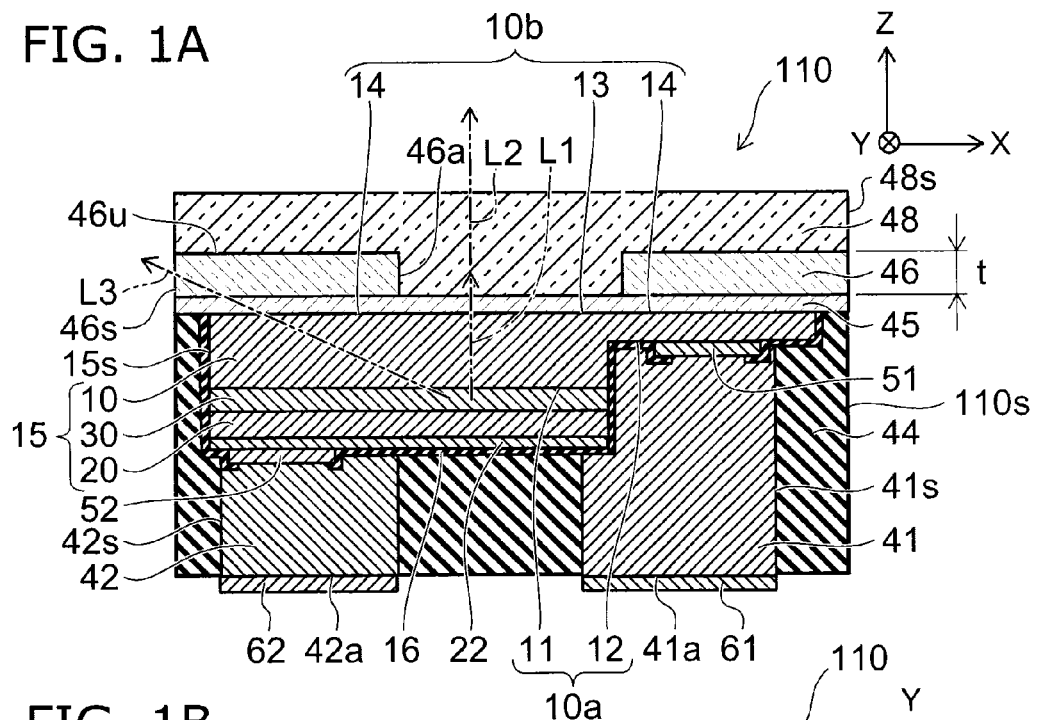
FIG. 1A and FIG. 1B are schematic views illustrating a semiconductor light emitting device according to a first embodiment.

According to one embodiment, a semiconductor light emitting device includes a light emitting unit, a first conductive pillar, a second conductive pillar, a sealing unit, a translucent layer, and a wavelength conversion layer. The light emitting unit includes a first semiconductor layer, a light emitting layer, and a second semiconductor layer. The first semiconductor layer has a first conductivity type and has a first major surface and a second major surface. The first major surface has a first portion and a second portion. The second major surface is opposed the first major surface and has a third portion and a fourth portion provided around the third portion. The light emitting layer is provided on the first portion. The second semiconductor layer has a second conductivity type and is provided on the light emitting layer. The first conductive pillar is provided on the second portion, extends along a first direction perpendicular to the first major surface, has a side face extending along the first direction, and is electrically connected to the first semiconductor layer. The second conductive pillar is provided on the second semiconductor layer, extends along the first direction, has a side face extending along the first direction, and is electrically connected to the second semiconductor layer. The sealing unit covers the side face of the first conductive pillar and the side face of the second conductive pillar. The translucent layer has translucency and is provided on the fourth portion. The wavelength conversion layer is provided on the third portion and on the translucent layer, absorbs at least a part of a first light emitted from the light emitting layer, and emits a second light having a peak wavelength different from the peak wavelength of the first light.

Various embodiments will be described hereinafter with reference to the accompanying drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to elements that have already appeared in the drawings and been described, and repetitious detailed descriptions of such elements are omitted.

First Embodiment

Figure 1B:
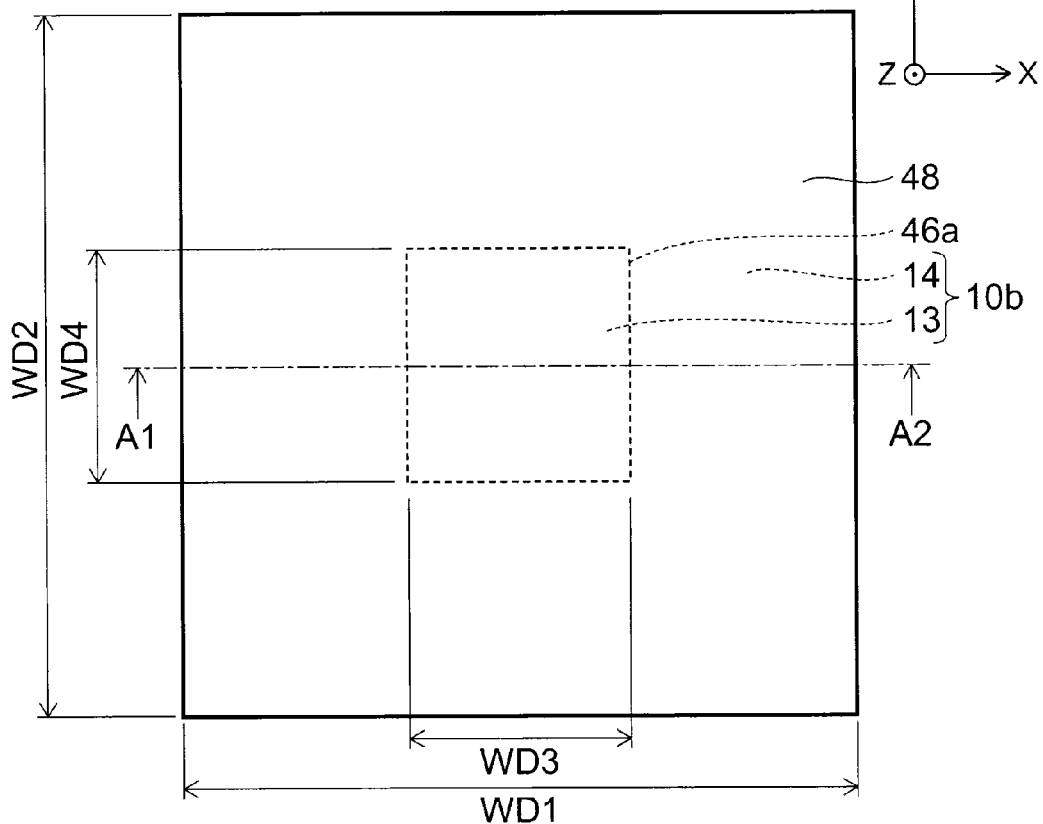

FIG. 1A and FIG. 1B are schematic views illustrating a semiconductor light emitting device according to a first embodiment.

FIG. 1A is a schematic cross-sectional view. FIG. 1B is a schematic plan view. FIG. 1A schematically illustrates a cross-section of line A1-A2 in FIG. 1B.

As illustrated in FIG. 1A and FIG. 1B, a semiconductor light emitting device 110 according to this embodiment is provided with a light emitting unit 15, a first conductive pillar 41, a second conductive pillar 42, a sealing unit 44, a translucent layer 46, and a wavelength conversion layer 48. The light emitting unit 15 includes a first semiconductor layer 10, a second semiconductor layer 20, and a light emitting layer 30.

The first semiconductor layer 10 has a first major surface 10a and a second major surface 10b on a side opposite the first major surface 10a. The second major surface 10b is, for example, substantially parallel to the first major surface 10a. The first semiconductor layer 10 has a first conductivity type. The first major surface 10a includes a first portion 11 opposing the second semiconductor layer 20 and a second portion 12 not opposing the second semiconductor layer 20. The first portion 11 is juxtaposed with the second portion 12. The second major surface 10b includes a third portion 13 and a fourth portion 14 provided around the circumference of the third portion 13. In the example, the fourth portion 14 is an annular shape that encompasses the third portion 13.

The light emitting layer 30 is provided on the first portion 11 of the first major surface 10a. The second semiconductor layer 20 is provided on the light emitting layer 30. The light emitting layer 30 is provided between the first semiconductor layer 10 and the second semiconductor layer 20. The second semiconductor layer 20 has a second conductivity type. The second conductivity type is a conductivity type that differs from the first conductivity type. For example, the first conductivity type is n-type and the second conductivity type is p-type. However, the embodiment is not limited thereto, and the first conductivity type may be p-type and the second conductivity type may be n-type. Hereafter, a case in which the first conductivity type is n-type, and the second conductivity type is p-type will be described.

The first semiconductor layer 10, the second semiconductor layer 20, and the light emitting layer 30 include nitride semiconductors, for example. The first semiconductor layer 10 includes an n-type clad layer, for example. The second semiconductor layer 20 includes a p-type clad layer, for example. The light emitting layer 30 has, for example, a single quantum well (SQW) structure or a multi quantum well (MQW) structure.

The light emitting layer 30 having a single quantum well structure includes two barrier layers and a well layer provided between the barrier layers. The light emitting layer 30 having a multi quantum well structure includes, for example, three or more barrier layers and well layers provided between each of the barrier layers respectively. For example, a GaN compound semiconductor may be used as the barrier layer. For example, am InGaN compound semiconductor may be used as the well layer. If the barrier layers contain In, the composition ratio of In in the barrier layers is less than the composition ratio of In in the well layers.

For example, a laminated crystalline film that will form the light emitting unit 15 is formed by crystal growth of the first semiconductor layer 10, the light emitting layer 30, and the second semiconductor layer 20 in that order on a substrate. A portion of this laminated crystalline film is removed from the second semiconductor layer 20 side until reaching the first semiconductor layer 10. By this, a portion (the second portion 12) of the first semiconductor layer 10 is exposed and the light emitting layer 30 and the second semiconductor layer 20 remain on the first portion 11. Thereby, the light emitting unit 15 is formed. The second portion 12 is juxtaposed with the first portion 11 in the X-Y plane. The light emitting unit 15 is separated from the substrate after, for example, crystal growth on the substrate.

Here, a direction from the first semiconductor layer 10 toward the second semiconductor layer 20 that is perpendicular to the first major surface 10a is defined as a "Z-axis direction" (first direction). A direction perpendicular to the Z-axis direction is defined as an "X-axis direction" (second direction). A direction perpendicular to the Z-axis direction and to the X-axis direction is defined as a "Y-axis direction" (third direction). The Z-axis direction does not have to be strictly perpendicular to the first major surface 10a.

In the example, the position (height) of the Z-axis direction of the first portion 11 is different from the position of the Z-axis direction of the second portion 12. The position of the Z-axis direction of the first portion 11 may also be substantially the same as the position of the Z-axis direction of the second portion 12.

In the example, the shape of the outline of the semiconductor light emitting device 110 when projected onto a plane (X-Y plane) parallel to the first major surface 10a (when viewed in the Z-axis direction) is rectangular. In the example, a side of the semiconductor light emitting device 110 is parallel to the X-axis direction. Another side that is perpendicular to the side of the semiconductor light emitting device 110 is parallel to the Y-axis direction. A length (width) WD1 of the side parallel to the X-axis direction of the semiconductor light emitting device 110 projected onto an X-Y plane is, for example, not less than 100 μm and not more than 1000 μm. In the example, it is, for example, 600 μm. A length WD2 of the side parallel to the Y-axis direction of the semiconductor light emitting device 110 projected onto an X-Y plane is, for example, not less than 100 μm and not more than 1000 μm. In the example, it is, for example, 600 μm.

In the example, the third portion 13 is a rectangular. The shape of the third portion 13 is, for example, a similar shape to the outline of the semiconductor light emitting device 110 projected onto an X-Y plane. The outline of the semiconductor light emitting device 110 projected onto an X-Y plane and the shape of the third portion 13 are not limited to a rectangular. For example, it may be circular or elliptical or it may be another polygon shape. The shape of the third portion 13 may also be different from the outline of the semiconductor light emitting device 110 projected onto an X-Y plane.

A thickness (length along the Z-axis direction) of the first semiconductor layer 10 is, for example, not less than 1 μm and not more than 10 μm. In the example, the thickness of the first semiconductor layer 10 is, for example, 5 μm. A thickness of the second semiconductor layer 20 is, for example, not less than 5 nm and not more than 300 nm. In the example, the thickness of the second semiconductor layer 20 is, for example, 100 nm. A thickness of the light emitting layer 30 is, for example, not less than 5 nm and not more than 100 nm. In the example, the thickness of the light emitting layer 30 is, for example, 10 nm.

A reflective layer 22 is provided on the second semiconductor layer 20. The reflective layer 22 is provided between the second semiconductor layer 20 and the sealing unit 44. The reflective layer 22 reflects light emitted from the light emitting layer 30. The reflectance of the reflective layer 22 on light emitted from the light emitting layer 30 is greater than the reflectance of, for example, the second semiconductor layer 20. By this, the luminous efficiency, for example, of the semiconductor light emitting device 110 can be improved. The metal material such as Ag, Al or the like or a metal stacked film containing these, for example, may be used in the reflective layer 22. A thickness of the reflective layer 22 is, for example, 0.3 μm (not less than 0.2 μm and not more than 0.4 μm).

The first conductive pillar 41 is provided on the second portion 12. The first conductive pillar 41 extends along the Z-axis direction. The first conductive pillar 41 has a side face 41s that extends along the Z-axis direction. The first conductive pillar 41 may be, for example, cylindrical or prismatic. The first conductive pillar 41 is electrically connected to the first semiconductor layer 10. A first electrode 51 is provided between the first semiconductor layer 10 and the first conductive pillar 41. The first conductive pillar 41 is electrically connected to the first semiconductor layer 10 via the first electrode 51. The first conductive pillar 41 may be electrically connected to the first semiconductor layer 10 by, for example, direct contact with the first semiconductor layer 10.

The second conductive pillar 42 is provided on the second semiconductor layer 20. The second conductive pillar 42 extends along the Z-axis direction. The second conductive pillar 42 has a side face 42s that extends along the Z-axis direction. The second conductive pillar 42 may be, for example, cylindrical or prismatic. The second conductive pillar 42 is electrically connected to the second semiconductor layer 20. A second electrode 52 is provided between the second semiconductor layer 20 and the second conductive pillar 42. The second conductive pillar 42 is electrically connected to the second semiconductor layer 20 via the second electrode 52 and the reflective layer 22. The second conductive pillar 42 may be electrically connected to the second semiconductor layer 20 by, for example, direct contact with the reflective layer 22.

A material having conductivity may be used in the first conductive pillar 41 and the second conductive pillar 42. A metal material such as copper, for example, may be used in the first conductive pillar 41 and the second conductive pillar 42. The first conductive pillar 41 and the second conductive pillar 42 are not limited to one but may be a plurality. A material having conductivity may be used in the first electrode 51 and the second electrode 52. A metal material such as Ni/Au, for example, may be used in the first electrode 51 and the second electrode 52. The first electrode 51 and the second electrode 52 are provided so as to correspond to the first conductive pillar 41 and the second conductive pillar 42. In addition, a conductive layer formed by a metal material such as copper, for example, may be additionally provided between the first conductive pillar 41 and the first electrode 51, and between the second conductive pillar 42 and the second electrode 52.

The sealing unit 44 covers the side face 41s of the first conductive pillar 41 and the side face 42s of the second conductive pillar 42. The light emitting unit 15 has a side face 15s that intersects with a plane (X-Y plane) parallel to the first major surface 10a. In the example, the sealing unit 44 also covers the side face 15s of the light emitting unit 15. The sealing unit 44 allows an end portion 41a of the first conductive pillar 41 and an end portion 42a of the second conductive pillar 42 to be exposed. The end portion 41a is an end portion on the opposite side to the side that contacts the first semiconductor layer 10, of the two end portions included in the prismatic shaped first conductive pillar 41. The end portion 42a is an end portion on the opposite side to the side that contacts the second semiconductor layer 20 of the two end portions included in the prismatic shaped second conductive pillar 42. By this, the sealing unit 44 holds, for example, the light emitting unit 15, the first conductive pillar 41, and the second conductive pillar 42. The sealing unit 44 protects, for example, the light emitting unit 15, the first conductive pillar 41, and the second conductive pillar 42. An insulating resin such as an epoxy resin, for example, may be used in the sealing unit 44. The sealing unit 44 may include, for example, a quartz filler, an alumina filler, or the like. By this, thermal conductivity of the sealing unit 44 can be improved and heat dissipation can be increased.

An insulating layer 16 is provided between the light emitting unit 15 and the sealing unit 44. In the example, the insulating layer 16 is provided between the reflective layer 22 and the sealing unit 44. The insulating layer 16 is provided, for example, of the light emitting unit 15, in the areas other than the second major surface 10b, the first electrode 51, and the second electrode 52 covered by the wavelength conversion layer 48, and covers the light emitting unit 15. By this, the insulating layer 16 increases the insulating properties between, for example, the light emitting unit 15 and the sealing unit 44. The insulating layer 16 protects the light emitting unit 15 from, for example, impurities and the like contained in the sealing unit 44.

An inorganic material such as $SiO_2$, SiN, phosphosilicate glass (PSG), boron phosphosilicate glass (BPSG), or the like is used in the insulating layer 16. An organic material such as photosensitive polyimide, benzocyclobutene, or the like, for example, may be used or a stacked body of an inorganic film and an organic film may be used as the insulating layer 16. A thickness of the insulating layer 16 is, for example, approximately 400 nm. CVD, vapor deposition, sputtering, or the like, for example, may be used in the formation of the insulating layer 16.

A first terminal 61 is provided on the first conductive pillar 41. The first terminal 61 is electrically connected to the first conductive pillar 41. The first terminal 61 contacts, for example, the end portion 41a of the first conductive pillar 41 to conduct with the first conductive pillar 41. A second terminal 62 is provided on the second conductive pillar 42. The second terminal 62 is provided so as to be separated from the first terminal 61. The second terminal 62 is electrically connected to the second conductive pillar 42. The second terminal 62 contacts, for example, the end portion 42a of the second conductive pillar 42 to conduct with the second conductive pillar 42.

The first terminal 61 and the second terminal 62 may be used for electrically connecting the semiconductor light emitting device 110 with external devices. In the example, the first terminal 61 is an n-side cathode and the second terminal 62 is a p-side anode. When using the semiconductor light emitting device 110, a voltage is applied between the first terminal 61 and the second terminal 62 so that the first terminal 61 is negative and the second terminal 62 is positive. By this, a voltage in the forward direction is applied to the light emitting unit 15, and light is emitted from the light emitting layer 30. The material having conductivity such as a metal material, for example, may be used in the first terminal 61 and the second terminal 62. The first terminal 61 and the second terminal 62 may have a single layer structure in which, for example, one material is used or a stacked structure in which a plurality of materials is used.

In the semiconductor light emitting device 110, the second major surface 10b of the first semiconductor layer 10 becomes a light extraction surface. In other words, in the example, the light emitted from the light emitting layer 30 exits outside the semiconductor light emitting device 110 from the second major surface 10b side. Frost processing is implemented on the second major surface 10b by, for example, wet etching, dry etching, or the like, and minute irregularities may be formed on the second major surface 10b. By this, for example, total reflection by the second major surface 10b may be suppressed for light emitted from the light emitting layer 30, thereby improving the light extraction efficiency of the semiconductor light emitting device 110.

The translucent layer 46 is provided on a fourth portion 14 from among the second major surface 10b of the first semiconductor layer 10. In the example, the translucent layer 46 is an annular shape that encompasses the third portion 13. In other words, in the translucent layer 46, an opening 46a is provided in a portion opposing the third portion 13. The shape of the opening 46a projected onto an X-Y plane is substantially the same as the shape of the third portion 13. In the example, the shape of the opening 46a projected onto an X-Y plane is, for example, a rectangular. The translucent layer 46 has translucency. The transmittance of the translucent layer 46 is, for example, not less than 80% of the first light L1 (luminescent light) emitted from the light emitting layer 30. In the example, the translucent layer 46 has a top face 46u parallel to the second major surface 10b. The top face 46u may also be not parallel to the second major surface 10b. The top face 46u may be, for example, a curved surface (spherical surface). When the top face 46u of the translucent layer 46 is parallel to the second major surface 10b, formation of, for example, the translucent layer 46 is easy.

The wavelength conversion layer 48 is provided on the third portion 13 and on the translucent layer 46. In other words, the wavelength conversion layer 48 is provided on the second major surface 10b. The translucent layer 46 is provided between the first semiconductor layer 10 and the wavelength conversion layer 48. The wavelength conversion layer 48 covers the light emitting unit 15 on the upper side of the second major surface 10b. The wavelength conversion layer 48 absorbs at least a part of the first light L1 (luminescent light) emitted from the light emitting layer 30 and emits a second light L2 having a peak wavelength that is different from the peak wavelength of the first light L1. In other words, the wavelength conversion layer 48 converts the peak wavelength of the light emitted from the light emitting layer 30. The wavelength conversion layer 48 may also emit, for example, light having a plurality of peak wavelengths that is different from the peak wavelength of the first light L1.

The shape of the outline of the wavelength conversion layer 48 projected onto an X-Y plane is substantially the same as the shape of the outline of the semiconductor light emitting device 110 projected onto an X-Y plane. In the example, the shape of the outline of the wavelength conversion layer 48 projected onto an X-Y plane is a rectangular. The length of a side parallel to the X-axis direction of the wavelength conversion layer 48 projected onto an X-Y plane is WD1. The length of a side parallel to the Y-axis direction of the wavelength conversion layer 48 projected onto an X-Y plane is WD2. The shape of the outline of the wavelength conversion layer 48 projected onto an X-Y plane may be different from the shape of the outline of the semiconductor light emitting device 110 projected onto an X-Y plane.

A distance (thickness of the wavelength conversion layer 48) along the Z-axis direction between the top face 48a of the wavelength conversion layer 48 and the second major surface 10b is, for example, not less than 10 μm and not more than 300 μm. In the example, the thickness of the wavelength conversion layer 48 is, for example, 120 μm.

In the example, a buffer layer 45 (intermediate layer) is provided between the second major surface 10b and the translucent layer 46 and between the second major surface 10b and the wavelength conversion layer 48. The buffer layer 45 is provided on the second major surface 10b. The buffer layer 45 is provided between the second major surface 10b and the translucent layer 46 to increase the adhesiveness of the translucent layer 46 to the second major surface 10b. The buffer layer 45 is provided between the second major surface 10b and the wavelength conversion layer 48 to increase the adhesiveness of the wavelength conversion layer 48 to the second major surface 10b. The buffer layer 45 can be omitted. The buffer layer 45 may not always be required if there is sufficient adhesion between, for example, the second major surface 10b and the translucent layer 46 and between the second major surface 10b and the wavelength conversion layer 48. A material having light transmittivity relative to the first light L1 emitted from the light emitting layer 30 may be used in the buffer layer 45. An inorganic material such as silicon oxide, silicon nitride, or the like or an organic material such as a silicone resin for example, may be used in the buffer layer 45. A length (thickness) along the Z-axis direction of the buffer layer 45 is, for example, not less than 0.1 μm and not more than 10 μm.

Figure 2A:
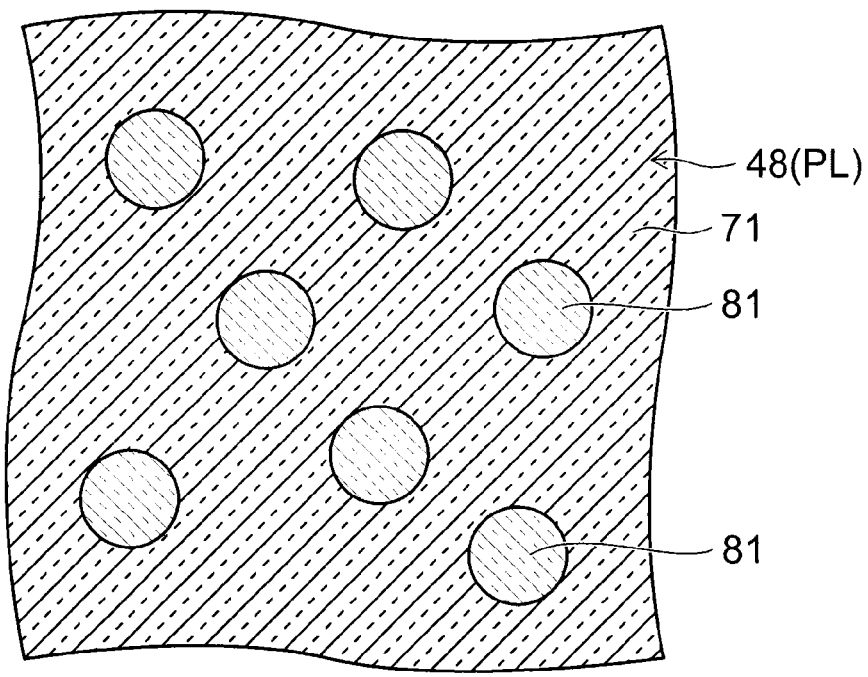
FIGS. 2A and 2B are schematic magnified views illustrating a part of the semiconductor light emitting device according to the first embodiment.
Figure 2B:
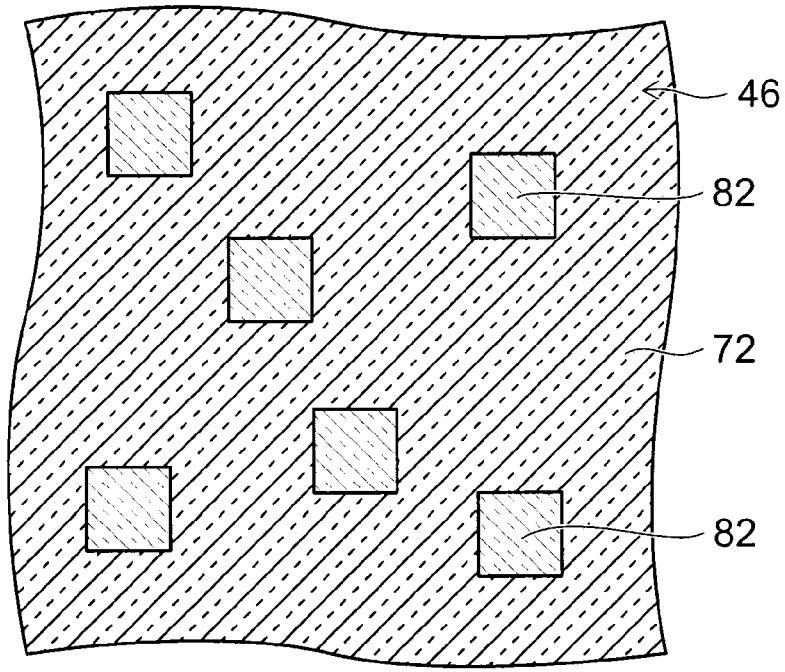

FIGS. 2A and 2B are schematic magnified views illustrating a part of the semiconductor light emitting device according to the first embodiment.

As illustrated in FIG. 2A, a phosphor layer PL, for example, is used in the wavelength conversion layer 48. The phosphor layer PL includes, for example, a first resin portion 71 having translucency and a plurality of first phosphor particles 81 dispersed in the first resin portion 71. The phosphor layer PL is formed, for example, by thermosetting a liquid first resin portion 71 in which a plurality of first phosphor particles 81 is dispersed.

A silicone resin, for example, is used in the first resin portion 71. Specifically, methyl phenyl silicone having a refractive index of approximate 1.5, for example, is used. Dimethyl silicone or other compositions of silicone resin may be used in the translucent layer 46. Furthermore, in the event that the luminance of the light emitted from the light emitting layer 30 is low, and there is little degradation due to the blue light, an epoxy resin, a mixture of epoxy resin and silicone resin, or an urethane resin or the like may be used.

For the first phosphor particles 81, for example, cerium induced YAG: Ce may be used as an activator to yttrium aluminate. The first phosphor particles 81 may be, for example, europium induced $(Sr, Ba)_2SiO_4$, $Ca_p (Si, Al)_{12}$ as an activator to strontium barium silicate. The particle size of the first phosphor particles 81 is, for example, not less than 1 μm and not more than 50 μm.

A stacked body of a plurality of phosphor layers PL that emit light having different peak wavelengths, for example, may be used as the wavelength conversion layer 48. The first light L1 of the light emitting layer 30 is, for example, an ultraviolet light, a violet light, or a blue light, and the second light L2 emitted from the wavelength conversion layer 48 is, for example, a yellow light, a red light, or a green light. The synthesized light of the first light L1 and the second light L2 emitted from the wavelength conversion layer 48 is, for example, substantially a white light. The synthesized light may also be, for example, a yellow light, red light, green light, or a blue light.

As illustrated in FIG. 2B, the translucent layer 46 includes, for example, a second resin portion 72 that has translucency. A material that is, for example, substantially the same as that used for the first resin portion 71, may be used in the second resin portion 72. In the example, the second resin portion 72 is, for example, methyl phenyl silicone having a refractive index of approximately 1.5. In the example, the refractive index of the translucent layer 46 is substantially the same as the refractive index of the wavelength conversion layer 48. A different resin material from that of the first resin portion 71 may be used for the second resin portion 72.

The translucent layer 46 may include, for example, a plurality of second phosphor particles 82 dispersed in the second resin portion 72. A material that is, for example, substantially the same as that of the first phosphor particles 81 may be used in the second phosphor particles 82. The material of the second phosphor particles 82 may be different from the material of the first phosphor particles 81. The peak wavelength of light emitted from the second phosphor particles 82 may be equivalent to the peak wavelength of light emitted from the first phosphor particles 81, or it may be different. The particle size of the second phosphor particles 82 is, for example, not less than 1 μm and not more than 10 μm. The translucent layer 46 may not include the second phosphor particles 82. When the translucent layer 46 includes the second phosphor particles 82, the concentration of the plurality of second phosphor particles 82 included in the translucent layer 46 is less than the concentration of the plurality of first phosphor particles 81 included in the wavelength conversion layer 48.

The translucent layer 46 has a side face 46s that intersects with a plane (X-Y plane) parallel to the second major surface 10b. The side face 46s of the translucent layer 46 is exposed to a side face 110s of the semiconductor light emitting device 110. The side face 46s of the translucent layer 46 configures a part of the side face 110s of the semiconductor light emitting device 110. In other words, the side face 46s of the translucent layer 46 is exposed to the outside. The side face 46s of the translucent layer 46 is positioned in-plane where a side face 48s of the wavelength conversion layer 48 is contained. The side face 46s of the translucent layer 46 is not covered by the wavelength conversion layer 48. However, at least a part of the side face 46s of the translucent layer 46 may be covered by the wavelength conversion layer 48.

As described above, the translucent layer 46 includes an opening 46a. Therefore, in the example, three light paths, first through third described below for example, may exit from the semiconductor light emitting device 110. In the first light path, the first light L1 emitted from the light emitting layer 30 enters the wavelength conversion layer 48 from the third portion 13 and is transmitted as is by only the wavelength conversion layer 48 and exits to the outside of the semiconductor light emitting device 110. In the second light path, the first light L1 enters the translucent layer 46 from the fourth portion 14 and is transmitted as is by only the translucent layer 46 and exits to the outside of the semiconductor light emitting device 110. In the third light path, the first light L1, after entering the translucent layer 46 from the fourth portion 14, enters the wavelength conversion layer 48 and is transmitted by the wavelength conversion layer 48 and exits to the outside of the semiconductor light emitting device 110. In this manner, providing a first light path that passes through the wavelength conversion layer 48 without passing through the translucent layer 46, a second light path that passes through the translucent layer 46 without passing through the wavelength conversion layer 48, and a third light path that passes through both, enables the characteristics of the respective light paths to be easily adjusted and more particularly makes it possible to easily obtain a semiconductor light emitting device having highly uniform characteristics.

With the first light path, a constant ratio of light of the first light L1 is converted to the second light L2. Meanwhile, with the second light path, the first light L1 exits to the outside as is without being converted. The peak wavelength of the third light L3 emitted from the side face 46s of the translucent layer 46 is shorter than the peak wavelength of the second light L2. The third light L3 may have a plurality of peak wavelengths such as, for example, the peak wavelength of the first light L1, the peak wavelength of the second light L2, or the like. In this case, the peak wavelength of the third light L3 is the wavelength of the peak having the highest intensity from among the plurality of peaks included in the third light L3.

A length (width) WD3 of the third portion 13 along the X-axis direction is, for example, not less than 10% and not more than 60% of the length WD1 of the wavelength conversion layer 48 along the X-axis direction. In other words, the length of the opening 46a along the X-axis direction is, for example, not less than 10% and not more than 60% of the length WD1 of the wavelength conversion layer 48 along the X-axis direction. Similarly, the length WD4 of the third portion 13 along the Y-axis direction is not less than 10% and not more than 60% of the length WD2 of the wavelength conversion layer 48 along the Y-axis direction. The length of the opening 46a along the Y-axis direction is also, for example, not less than 10% and not more than 60% of the length WD2 of the wavelength conversion layer 48 along the Y-axis direction.

In the example, the length WD1 and the length WD2 are, for example, 600 μm. Accordingly, in the example, the length WD3 and the length WD4 are, for example, not less than 60 μm and not more than 360 μm. Furthermore, in the example, the shape of the wavelength conversion layer 48 projected onto an X-Y plane is rectangular. Therefore, the length WD1 and the length WD2 are the length of one side of the shape of the wavelength conversion layer 48 projected onto an X-Y plane, respectively. In the example, the third portion 13 is rectangular. Therefore, the length WD3 and the length WD4 are the length of one side of the third portion 13, respectively.

A thickness (length) t along the Z-axis direction of the translucent layer 46 is, for example, not less than 5% and not more than 20% of the geometric averages (geometric mean) of the length WD1 of the wavelength conversion layer 48 along the X-axis direction and the length WD2 of the wavelength conversion layer 48 along the Y-axis direction. In other words, the thickness t is expressed by the following equation (1).

$$0.05 \times (WD1 \times WD2)^{1/2} \leq t \leq 0.2 \times (WD1 \times WD2)^{1/2} \quad (1)$$

For example, when the length WD1 and the length WD2 are 600 μm, it is preferred that the thickness t be, for example, not less than 30 μm and not more than 120 μm. In the example, the thickness t is, for example, 30 μm.

Figure 3A:
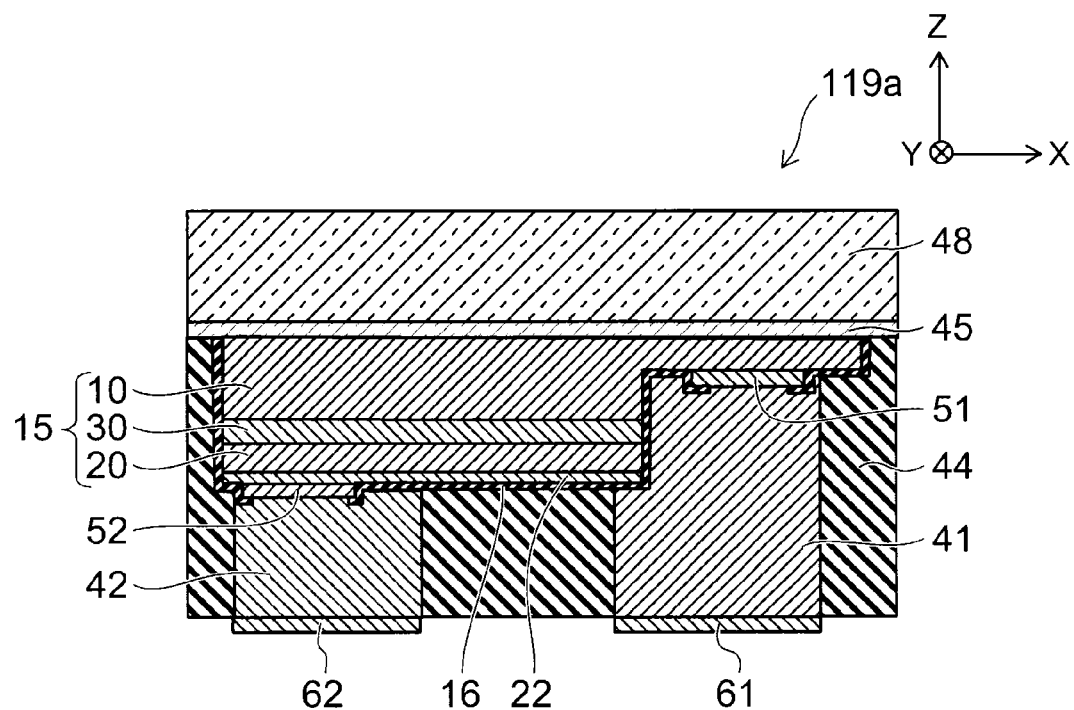
FIGS. 3A and 3B are schematic views illustrating a semiconductor light emitting device of reference examples.
Figure 3B:
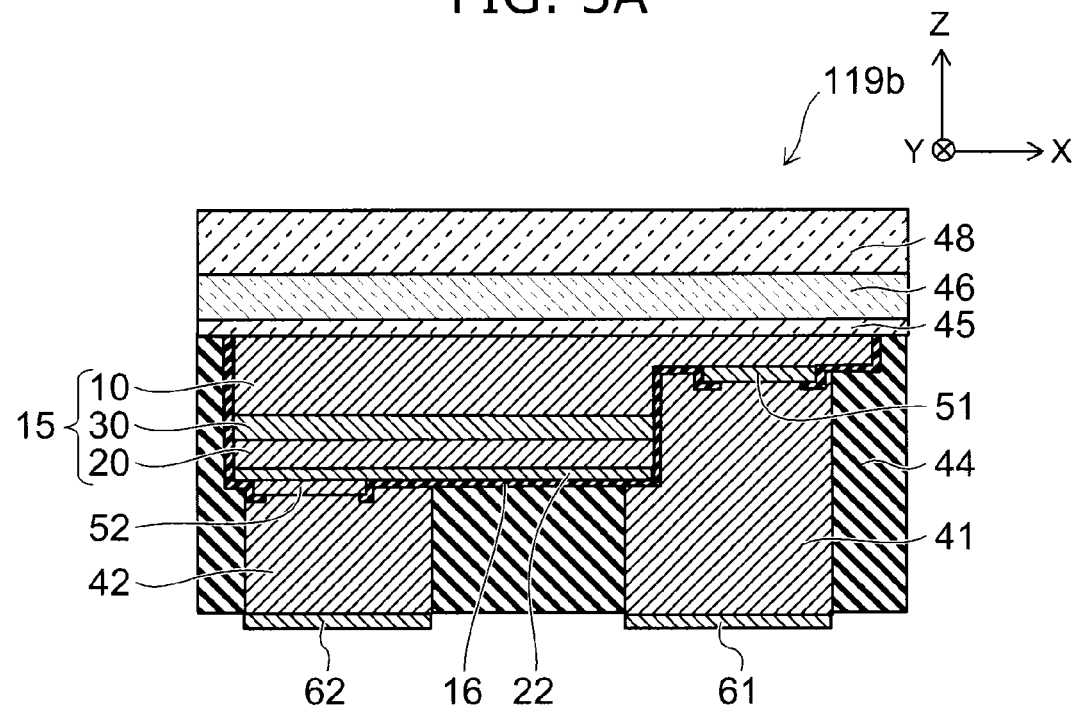

FIGS. 3A and 3B are schematic views illustrating a semiconductor light emitting device of reference examples.

As illustrated in FIG. 3A, in a semiconductor light emitting device 119a of the Reference Example, the translucent layer 46 is not provided.

As illustrated in FIG. 3B, the translucent layer 46 of a semiconductor light emitting device 119b of the Reference Example is provided on the entire second major surface 10b. In other words, the opening 46a is not formed in the translucent layer 46 of the semiconductor light emitting device 119b.

In the semiconductor light emitting device 119a and the semiconductor light emitting device 119b, configurations other than the translucent layer 46 may be substantially the same as the semiconductor light emitting device 110.

There is a problem with chromaticity deviation in the configuration of the semiconductor light emitting device 119a in that the chromaticity changes depending on the angle of emitted light, in other words, angular orientation. This is considered to be because the distance to pass through the wavelength conversion layer 48 changes depending on the angular orientation. For example, when the first light L1 is a blue light, phosphor particles that convert blue light to yellow light are used as the first phosphor particles 81, and adjustments are made to create a white light in the Z-axis direction. In this case, the second light L2 becomes dominant as the angle between the direction where light is emitted and the Z-axis direction becomes greater (approaching the X-axis direction or Y-axis direction). In this manner, the extent of yellow color increases as the angle between the direction where light is emitted and the Z-axis direction becomes greater. This type of light appears as a yellow ring.

The inventors of this application have investigated chromaticity deviation by simulating respective configurations for the semiconductor light emitting device 119a and the semiconductor light emitting device 119b. In the simulation, the length WD1 of the wavelength conversion layer 48 along the X-axis direction was 640 μm. The length WD2 of the wavelength conversion layer 48 along the Y-axis direction was 340 μm. The length WD3 of the third portion 13 along the X-axis direction was 235 μm. The length WD4 of the third portion 13 along the Y-axis direction was 125 μm. The thickness t was 40 μm. In the simulation, the Z-axis direction was at 0° and the chromaticity for the respective directions parallel to the X-axis direction and the Y-axis direction were evaluated. A Y value Cy of an XYZ colorimetric system which is a CIE standard colorimetric system was calculated as the chromaticity.

FIG. 4A to FIG. 4F are graphs showing properties of the semiconductor light emitting device according to the first embodiment.

Figure 4A:
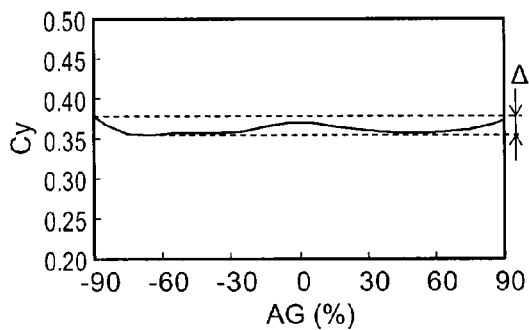
FIG. 4A to FIG. 4F are graphs showing properties of the semiconductor light emitting device according to the first embodiment.

FIG. 4A shows the results of a simulation in a direction parallel to the X-axis direction of the semiconductor light emitting device 110.

Figure 4B:
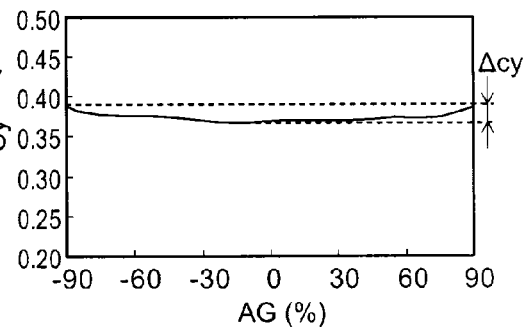

FIG. 4B shows the results of a simulation in a direction parallel to the Y-axis direction of the semiconductor light emitting device 110.

Figure 4C:
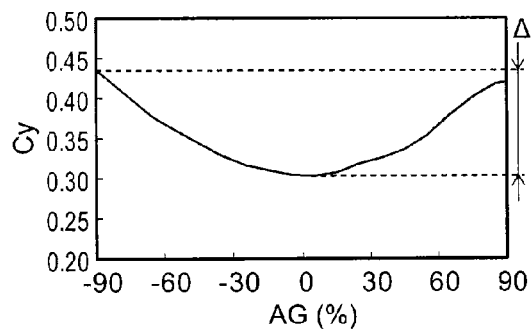

FIG. 4C shows the results of a simulation in a direction parallel to the X-axis direction of the semiconductor light emitting device 119a.

Figure 4D:
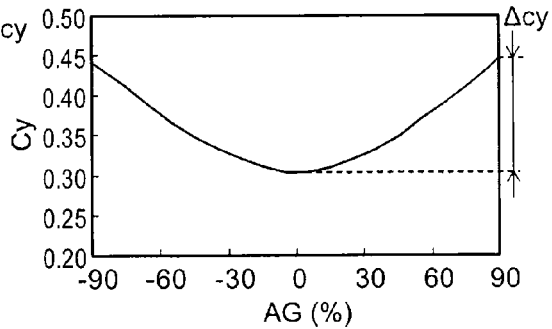
Figure 4E:
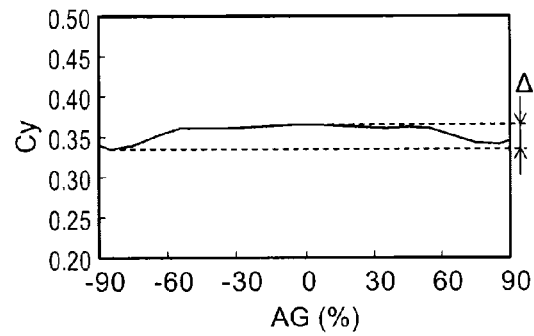

FIG. 4D shows the results of a simulation in a direction parallel to the Y-axis direction of the semiconductor light emitting device 119a FIG. 4E shows the results of a simulation in a direction parallel to the X-axis direction of the semiconductor light emitting device 119b.

Figure 4F:
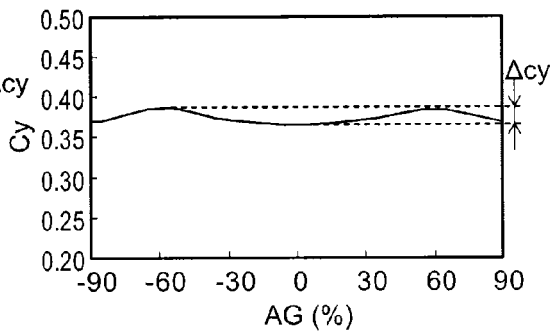

FIG. 4F shows the results of a simulation in a direction parallel to the Y-axis direction of the semiconductor light emitting device 119b.

In FIG. 4A to FIG. 4F, the horizontal axis respectively is the angle AG (°). The vertical axis is the Y value Cy. In the horizontal axis, for example, if the angle of light toward the Z-axis direction is 0°, then the angle of light toward the +X direction and toward the +Y direction is +90°, and the angle of light toward the −X direction and toward the −Y direction is −90°. Further, in the simulation, the absolute value for the difference between the maximum value of the Y value Cy and the minimum value of the Y value Cy in each range from +90° to −90° was ΔCy.

As shown in FIG. 4A, ΔCy in a direction parallel to the X-axis direction of the semiconductor light emitting device 110 is approximately 0.014.

As shown in FIG. 4B, ΔCy in a direction parallel to the Y-axis direction of the semiconductor light emitting device 110 is approximately 0.014.

As shown in FIG. 4C, ΔCy in a direction parallel to the X-axis direction of the semiconductor light emitting device 119a is approximately 0.121.

As shown in FIG. 4D, ΔCy in a direction parallel to the Y-axis direction of the semiconductor light emitting device 119a is approximately 0.131.

As shown in FIG. 4E, ΔCy in a direction parallel to the X-axis direction of the semiconductor light emitting device 119b is approximately 0.031.

As shown in FIG. 4F, ΔCy in a direction parallel to the Y-axis direction of the semiconductor light emitting device 119b is approximately 0.022.

In this manner, chromaticity deviation can be suppressed in a configuration in which the translucent layer 46 is provided between the second major surface 10b and the wavelength conversion layer 48 compared to a configuration in which the translucent layer 46 is not provided. When the translucent layer 46 is provided, more of the first light L1 exits from the side face 46s of the translucent layer 46. This is considered to be because a synthesized light made of the third light L3 exiting from the side face 46s of the translucent layer 46 and a light in which the second light L2 is dominant due to a large angle from the Z-axis direction approaches the wavelength of the target light. In the example, it is considered to be substantially approaching a white light.

Furthermore, in the semiconductor light emitting device 110, chromaticity deviation can be further suppressed, compared to the semiconductor light emitting device 119b that does not have an opening 46a. ΔCy is required to be not more than 0.02 depending on the LED product. ΔCy in the semiconductor light emitting device 119b is over 0.02. Meanwhile, ΔCy in the semiconductor light emitting device 110 is below 0.02 in both the direction parallel to the X-axis direction and the direction parallel to the Y-axis direction, and thus it can be seen that favorable optical properties can be obtained. In this manner, suppression of chromaticity deviation in the configuration in which an opening 46a is provided in the translucent layer 46 is a new effect discovered by experiments of the inventors of this application.

Figure 5A:
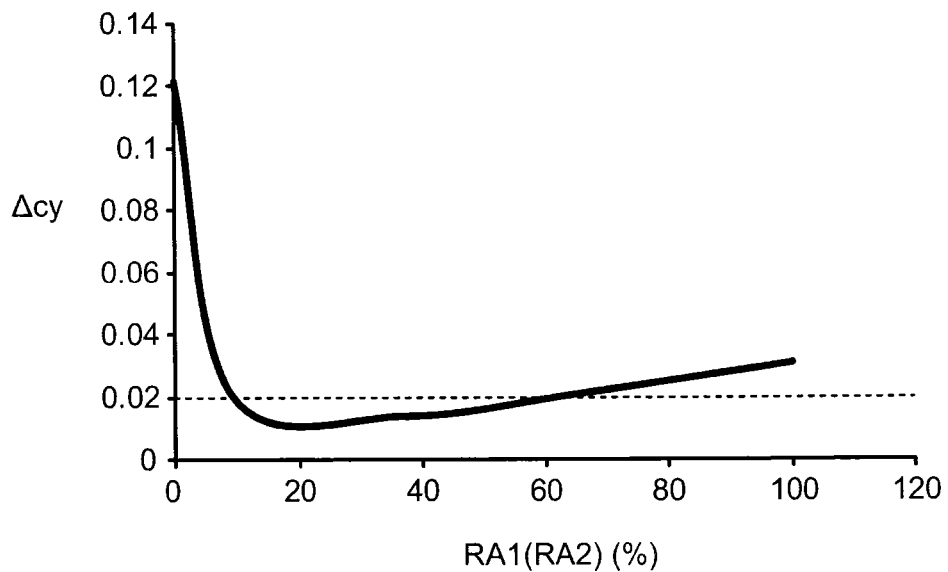
FIG. 5A and FIG. 5B are graphs showing properties of the semiconductor light emitting device according to the first embodiment.
Figure 5B:
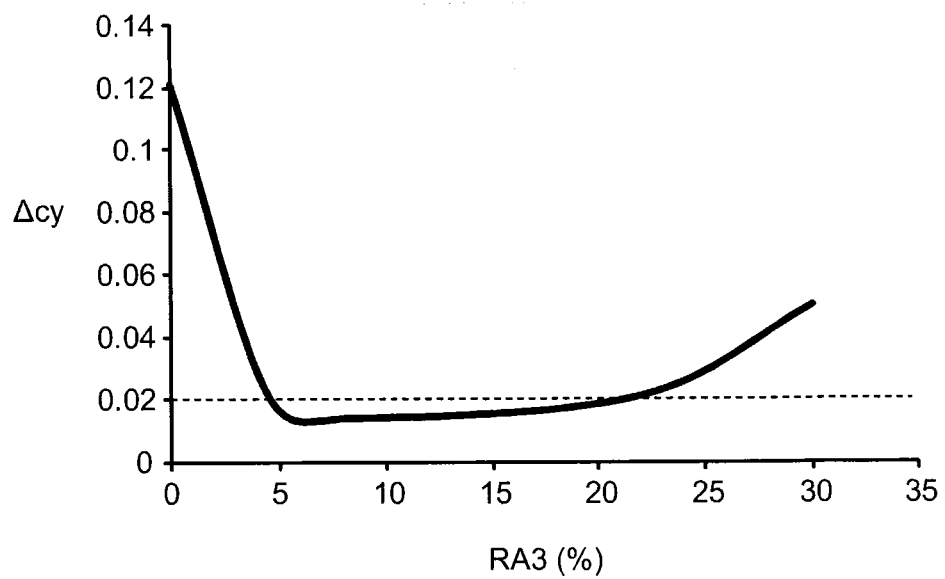

FIG. 5A and FIG. 5B are graphs showing properties of the semiconductor light emitting device according to the first embodiment.

FIG. 5A shows changes in ΔCy for when the length WD3 of the third portion 13 along the X-axis direction and the length WD4 of the third portion 13 along the Y-axis direction are changed.

The horizontal axis of FIG. 5A is a ratio RA1 (%) of the length WD3 to the length WD1, and a ratio RA2 (%) of the length WD4 to the length WD2. The vertical axis is the ΔCy. In the example, an evaluation was performed with the ratio RA1 and the ratio RA2 as the same. In the example, the length WD1 was 640 μm and the length WD2 was 340 μm. Further, in the example, ΔCy was evaluated in a direction parallel to the X-axis direction.

From the simulation given above, the ΔCy was approximately 0.031 when the translucent layer 46 was not provided, which is to say, when the ratio RA1 and the ratio RA2 were 100%. When the opening 46a was not provided, which is to say, when the ratio RA1 and the ratio RA2 were 0%, ΔCy was approximately 0.121. Further, the ratio RA1, when the length WD3 is 235 μm, and the ratio RA2, when the length WD4 is 125 μm, were respectively approximately 36.9%. In this case, ΔCy was approximately 0.014. Similarly, the graph of FIG. 5A was obtained by arbitrarily changing the ratio RA1 and the ratio RA2.

As shown in FIG. 5A, in order for the ΔCy to be not more than 0.02 which is the evaluation standard for the product, the ratio RA1 and the ratio RA2 is within the range of not less than 10% and not more than 60%. Therefore, it is preferable that the length WD3 of the third portion 13 along the X-axis direction be not less than 10% and not more than 60% of the length WD1 of the wavelength conversion layer 48 along the X-axis direction. It is preferable that the length WD4 of the third portion 13 along the Y-axis direction be not less than 10% and not more than 60% of the length WD2 of the wavelength conversion layer 48 along the Y-axis direction. By this, chromaticity deviation of the semiconductor light emitting device can be appropriately suppressed.

FIG. 5B shows changes in the ΔCy for when the thickness t along the Z-axis direction of the translucent layer 46 is changed.

The horizontal axis of FIG. 5B is a ratio RA3 (%) to the geometric average of the length WD1 and the length WD2. The vertical axis is the ΔCy. In the example, the length WD1 was 640 μm and the length WD2 was 340 μm. The length WD3 was 235 μm. The length WD4 was 125 μm. Further, in the example, ΔCy was evaluated in a direction parallel to the X-axis direction.

From the simulation given above, the ΔCy was approximately 0.121 when the translucent layer 46 was not provided, which is to say, when RA3 was 0%. When the thickness t is 40 μm, which is to say, when the ratio RA3 is approximately 8.57%, ΔCy is approximately 0.014. Similarly, the graph of FIG. 5B was obtained by arbitrarily changing the ratio RA3.

As shown in FIG. 5B, in order for the ΔCy to be not more than 0.02 which is the evaluation standard for the product, the ratio RA3 is within the range of not less than 5% and not more than 20%. Therefore, it is preferred that the thickness t along the Z-axis direction of the translucent layer 46 be not less than 5% and not more than 20% of the geometric average of the length WD1 of the wavelength conversion layer 48 along the Z-axis direction and the length WD2 of the wavelength conversion layer 48 along the Y-axis direction. By this, chromaticity deviation of the semiconductor light emitting device can be appropriately suppressed.

Figure 6:
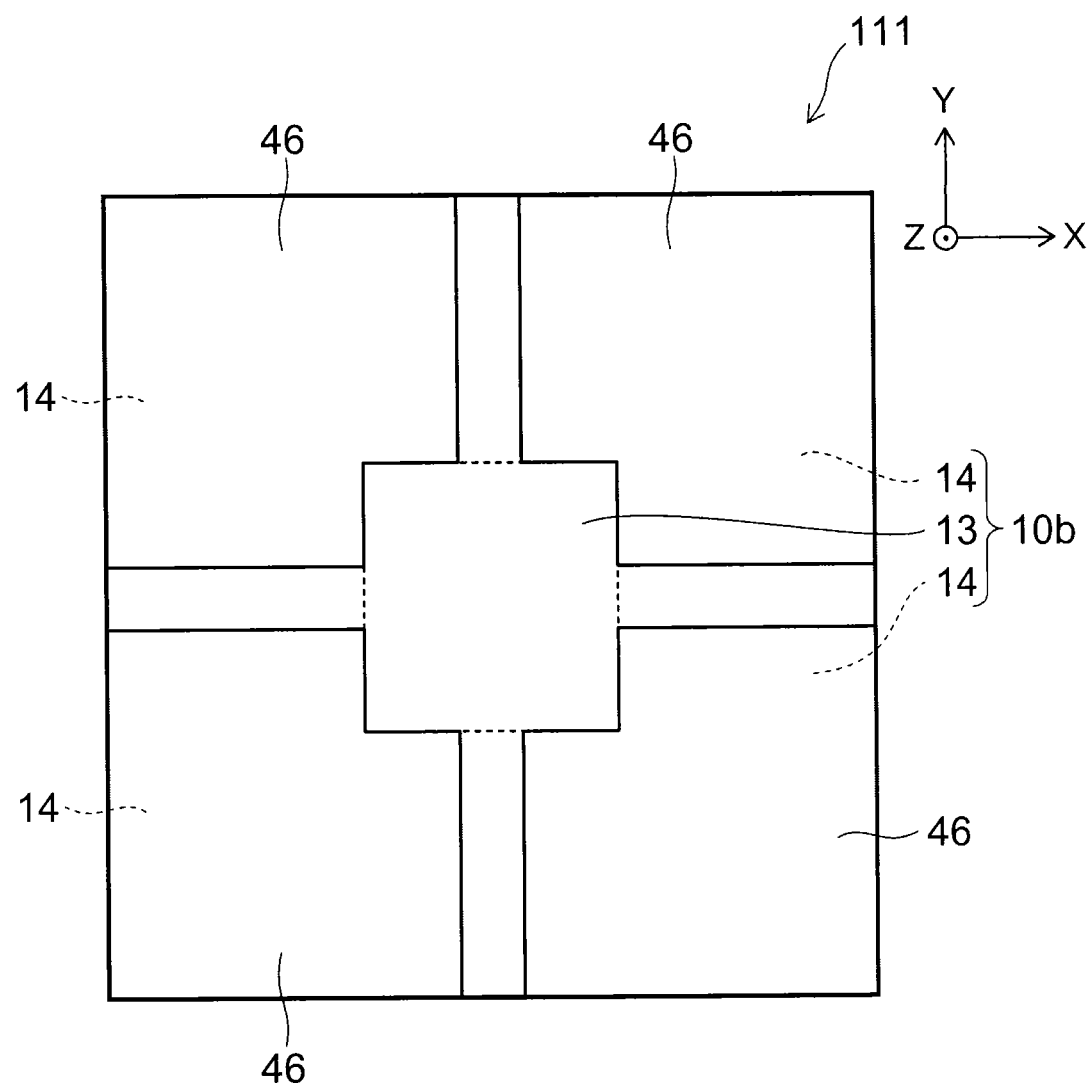
FIG. 6 is a schematic plan view illustrating a part of another semiconductor light emitting device according to the first embodiment.

FIG. 6 is a schematic plan view illustrating a part of another semiconductor light emitting device according to the first embodiment.

As illustrated in FIG. 6, in another semiconductor light emitting device 111 according to this embodiment, a plurality of fourth portions 14 is provided around the third portion 13 having a rectangular shape. In the example, for example, four fourth portions 14 are provided. In addition, in the semiconductor light emitting device 111, a plurality of translucent layers 46 is provided on each of the plurality of fourth portions 14. Note that, in FIG. 6, illustration of the wavelength conversion layer 48 is omitted for convenience.

In this manner, the translucent layer 46 is not limited to the configuration of an annular shape that encompasses the third portion 13 but may be provided in plurality around the third portion 13. A plurality of translucent layers 46 may also be provided by dividing, for example, the annular shaped translucent layer 46. Further, the plurality of translucent layers 46 may also be provided, for example, on at least a part of an annular shaped fourth portion 14 that encompasses around the third portion 13.

Second Embodiment

Figure 7:
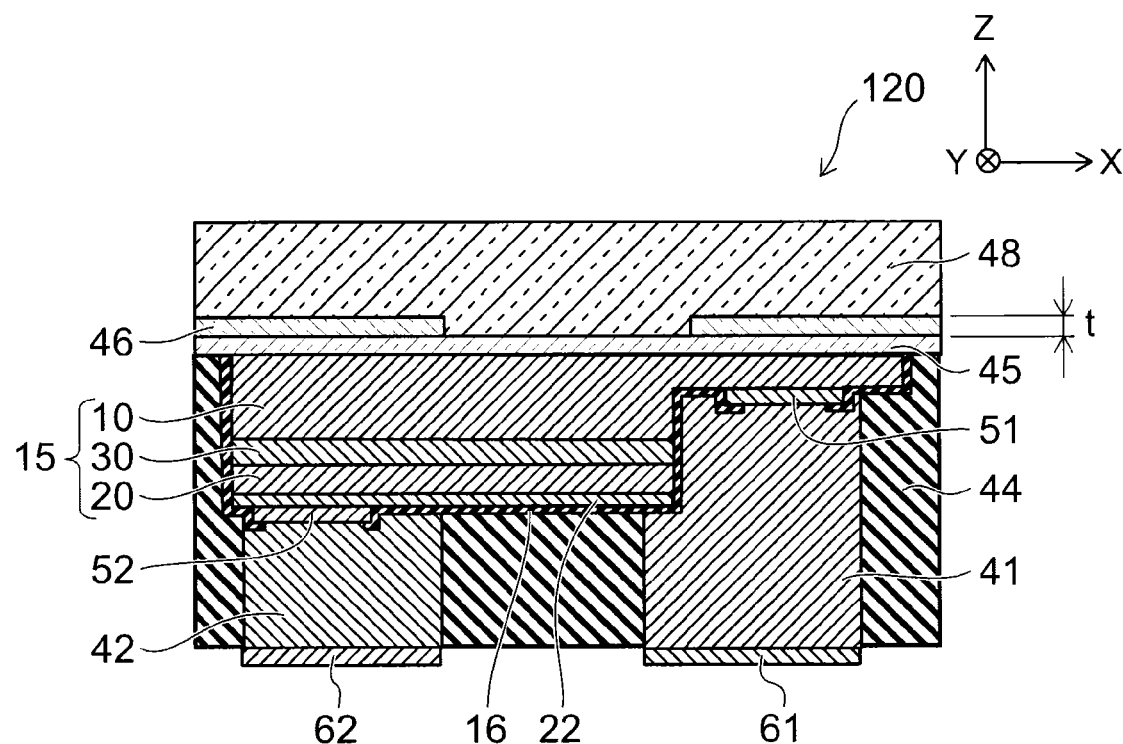
FIG. 7 is a schematic cross-sectional view illustrating another semiconductor light emitting device according to a second embodiment.

FIG. 7 is a schematic cross-sectional view illustrating another semiconductor light emitting device according to a second embodiment.

In a semiconductor light emitting device 120 according to this embodiment, the refractive index of the translucent layer 46 is greater than the refractive index of the wavelength conversion layer 48. Further, in the semiconductor light emitting device 120, the thickness t along the Z-axis direction of the translucent layer 46 is expressed by the following expression (2).

$$0.02 \times (WD1 \times WD2)^{1/2} \leq t \leq 0.1 \times (WD1 \times WD2)^{1/2} \quad (2)$$

In other words, the thickness t of the translucent layer 46 of the semiconductor light emitting device 120 is thinner than the thickness t of the translucent layer 46 of the semiconductor light emitting device 110. As the configuration is similar to that given for the semiconductor light emitting device 110 other than the refractive index of the translucent layer 46, the refractive index of the wavelength conversion layer 48, and the thickness of the translucent layer 46, descriptions thereof are omitted.

In the example, a refractive index n1 of the wavelength conversion layer 48 is, for example, 1.41. Meanwhile, a refractive index n2 of the translucent layer 46 is, for example, 1.51. In this manner, the refractive index n2 of the translucent layer 46 is greater by, for example, 0.1 than the refractive index n1 of the wavelength conversion layer 48. The refractive index n1 of the wavelength conversion layer 48 is, for example, not less than 1.38 and not more than 1.45. The refractive index n2 of the translucent layer 46 is, for example, not less than 1.5 and not more than 1.55. The absolute value of the difference n2−n1 of the refractive index n1 and the refractive index n2 is, for example, not less than 0.05 and not more than 0.17.

Figure 8:
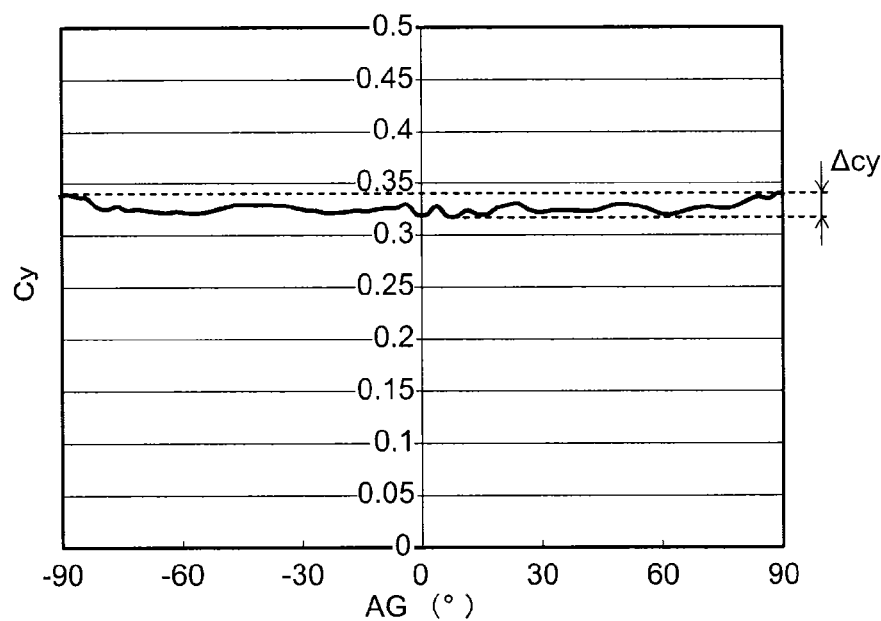
FIG. 8 is a graph showing properties of the semiconductor light emitting device according to the second embodiment.

FIG. 8 is a graph showing properties of the semiconductor light emitting device 120 according to the second embodiment.

FIG. 8 shows the results of a simulation in a direction parallel to the X-axis direction of the semiconductor light emitting device 120. In FIG. 8, the horizontal axis is the angle AG (°). The vertical axis is the Y value Cy.

In the simulation, the length WD1 of the wavelength conversion layer 48 along the X-axis direction was 600 μm. The length WD2 of the wavelength conversion layer 48 along the Y-axis direction was 600 μm. The length WD3 of the third portion 13 along the X-axis direction was 235 μm. The length WD4 of the third portion 13 along the Y-axis direction was 235 μm. The thickness t was 5 μm. The refractive index n1 of the wavelength conversion layer 48 was 1.41. The refractive index n2 of the translucent layer 46 was 1.51.

As shown in FIG. 8, in the semiconductor light emitting device 120, the ΔCy is within the range of 0.02. In this manner, in the semiconductor light emitting device 120, increasing the refractive index n2 of the translucent layer 46 to be greater than the refractive index n1 of the wavelength conversion layer 48 allows chromaticity deviation to be suppressed even if the thickness t of the translucent layer 46 is thin.

Increasing the refractive index n2 of the translucent layer 46 to be greater than the refractive index n1 of the wavelength conversion layer 48 facilitates the total reflection of light in the interface between the translucent layer 46 and the wavelength conversion layer 48. Therefore, even if the thickness t of the translucent layer 46 is thin, the ratio of the first light L1 emitted from the side face 46s of the translucent layer 46 can be increased. By this, substantially the same effect as the semiconductor light emitting device 110 can be obtained with the semiconductor light emitting device 120. Further, in the semiconductor light emitting device 120, formation of the wavelength conversion layer 48 can be easier, for example, by the amount that the thickness t of the translucent layer 46 was thinned. For example, manufacturing steps can be simplified for the semiconductor light emitting device 120.

Hereinafter, an example of a manufacturing method of the semiconductor light emitting device 120 will be described. The following manufacturing method is also a manufacturing method of the semiconductor light emitting device 110.

FIGS. 9A to 9C and FIGS. 10A to 10C are schematic cross-sectional views illustrating a method for manufacturing a semiconductor light emitting device according to the second embodiment.

Figure 9A:
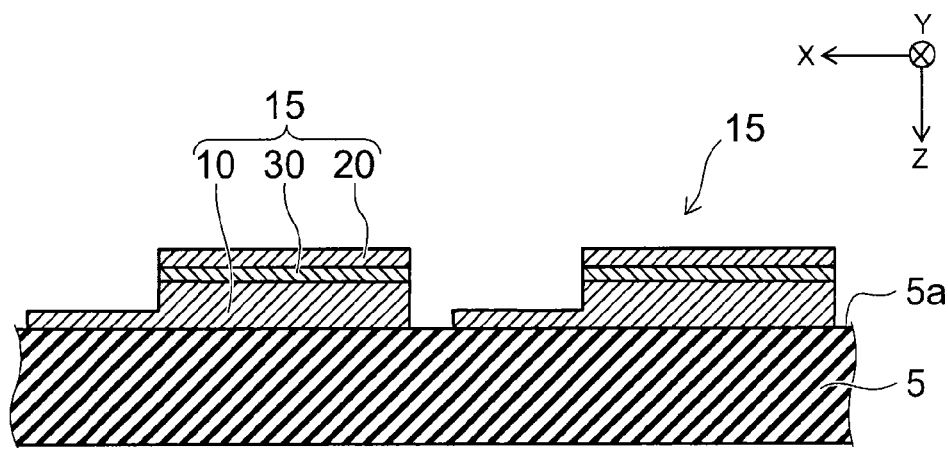
FIG. 9A to FIG. 9C are schematic cross-sectional views illustrating a method for manufacturing a semiconductor light emitting device according to the second embodiment.

As illustrated in FIG. 9A, for example, a plurality of light emitting units 15 is formed on a surface 5a of a growth-use substrate 5. In the formation of the plurality of light emitting units 15, a stacked body is formed by laminating in the order of, for example, a film to be the first semiconductor layer 10, a film to be the light emitting layer 30, and a film to be the second semiconductor layer 20. A portion of the stacked body is removed by, for example, a lithography process or an etching process. By this, a plurality of light emitting units 15 is formed on the surface 5a.

For example, a glass substrate such as a sapphire glass may be used as the growth-use substrate 5. Further, the growth-use substrate 5 may also be a semiconductor substrate. For example, a metalorganic chemical vapor deposition (MOCVD) method may be used in the formation of the stacked body. For example, a crystal layer that includes a nitride semiconductor may be grown epitaxially on the growth-use substrate 5. For example, a buffer layer may be provided between the growth-use substrate 5 and the film that becomes the first semiconductor layer 10. The buffer layer has functions for, for example, lattice matching and stress relaxation with the growth-use substrate 5.

Figure 9B:
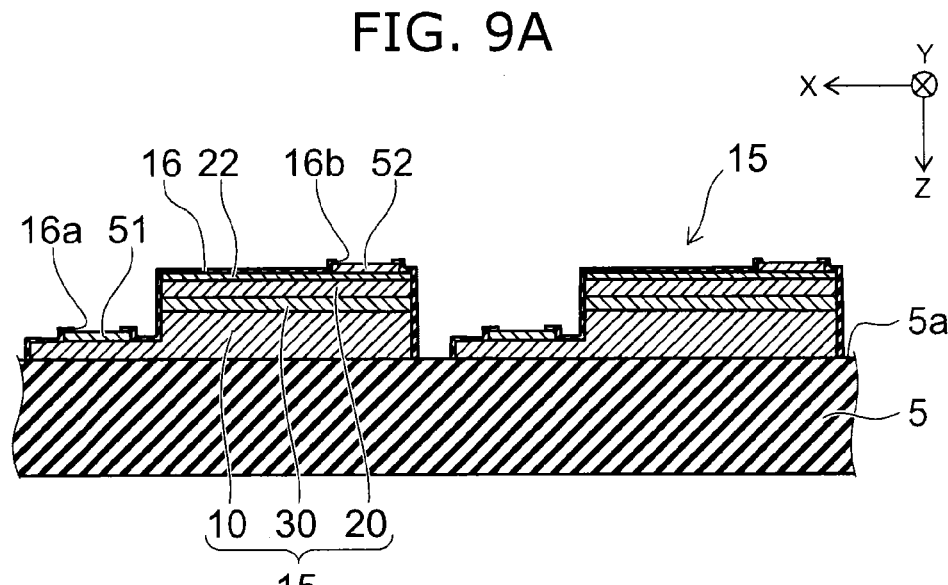

As illustrated in FIG. 9B, the reflective layer 22 is formed on each of the plurality of second semiconductor layers 20 by, for example, a film deposition process, a lithography process, or an etching process. The first electrode 51 is formed on the second portion 12 of each of the plurality of first semiconductor layers 10. The second electrode 52 is formed on each of the plurality of reflective layers 22. The first electrode 51 and the second electrode 52 may be formed at the same time or may be formed separately. The insulating layer 16 is formed on each of the plurality of light emitting units 15. An opening 16a that allows the first electrode 51 to be exposed and an opening 16b that allows the second electrode 52 to be exposed are formed on the insulating layer 16.

Figure 9C:
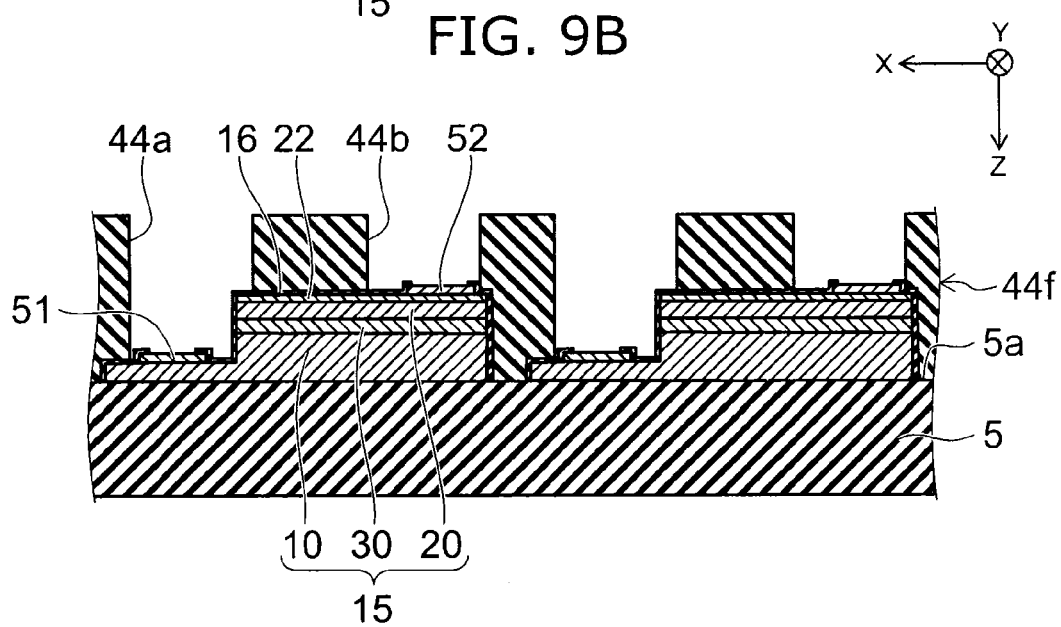

As illustrated in FIG. 9C, a resin film 44f that becomes a sealing unit 44 is formed on the surface 5a of the growth-use substrate 5 and on each of the plurality of light emitting units 15. On the resin film 44f, a through hole 44a for forming the first conductive pillar 41 is formed on a portion that opposes the first electrode 51 and a through hole 44b for forming the second conductive pillar 42 is formed on a portion that opposes the second electrode 52.

Figure 10A:
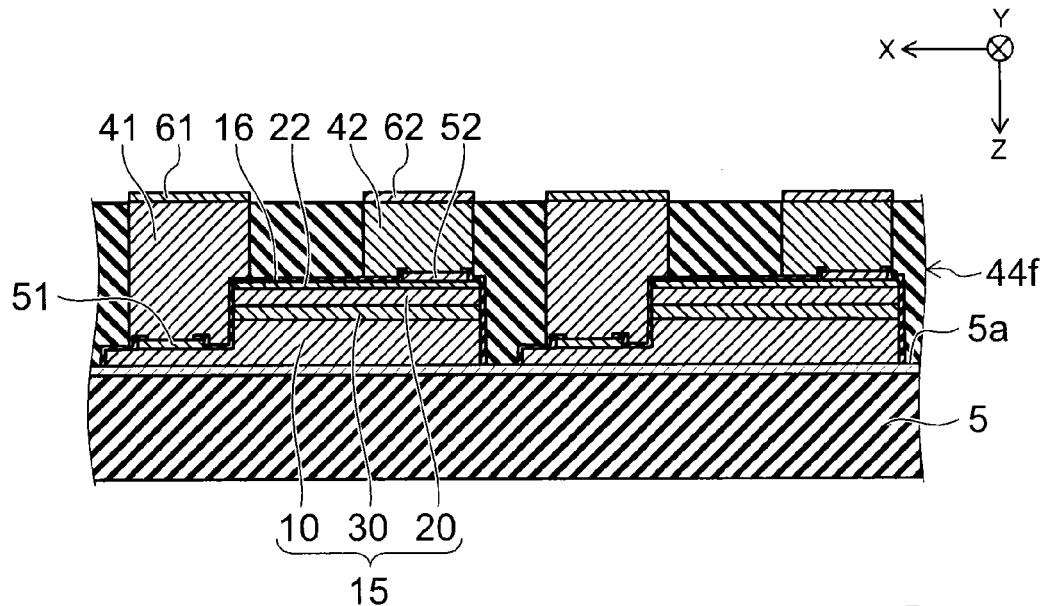
FIG. 10A to FIG. 10C are schematic cross-sectional views illustrating a method for manufacturing a semiconductor light emitting device according to the second embodiment.

As illustrated in FIG. 10A, the first conductive pillar 41 and the second conductive pillar 42 are formed by burying a conductive material in the through hole 44a and in the through hole 44b. The first conductive pillar 41 and the second conductive pillar 42 may be formed at the same time or may be formed separately.

The first terminal 61 is formed on the first conductive pillar 41 by, for example, a film deposition process, a lithography process, or an etching process. The second terminal 62 is formed on the second conductive pillar 42. The first terminal 61 and the second terminal 62 may be formed at the same time or may be formed separately.

Figure 10B:
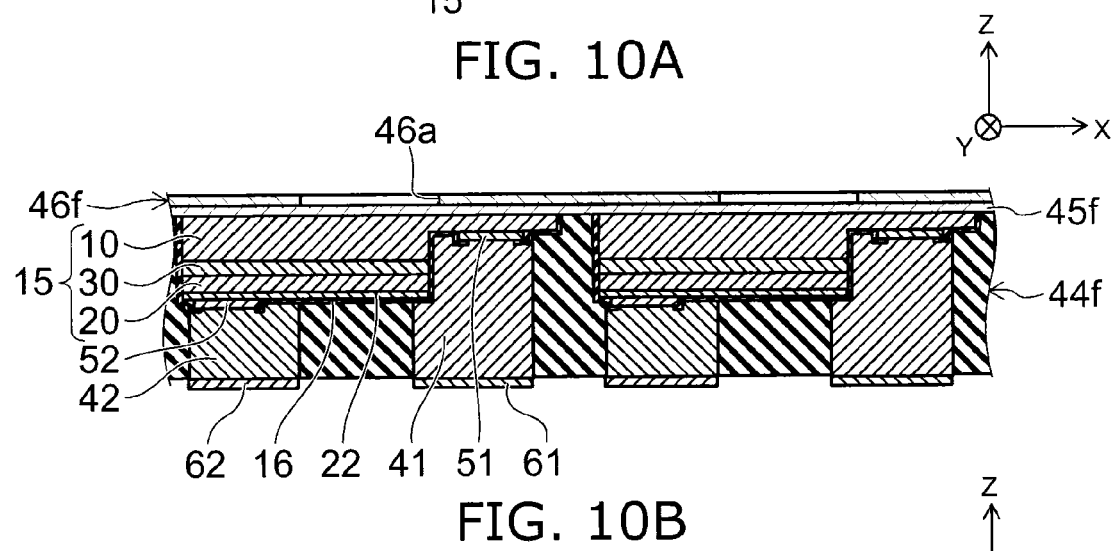

As illustrated in FIG. 10B, the growth-use substrate 5 is removed from the resin film 44f and the plurality of light emitting units 15 by, for example, a laser lift off method or the like. A buffer film 45f that will be the buffer layer 45 is formed on the resin film 44f and on the second major surface 10b of the first semiconductor layer 10 of each of the plurality of light emitting units 15.

A translucent film 46f that will be the translucent layer 46 is formed on the buffer film 45f by, for example, a film deposition process, a lithography process, or an etching process. The translucent film 46f is formed at a film thickness that is determined by, for example, equation (2) or equation (1). In the example, the film thickness of the translucent film 46f is, for example, 5 µm. In the translucent film 46f, the opening 46a is formed in a position that corresponds to each of the plurality of light emitting units 15.

Figure 10C:
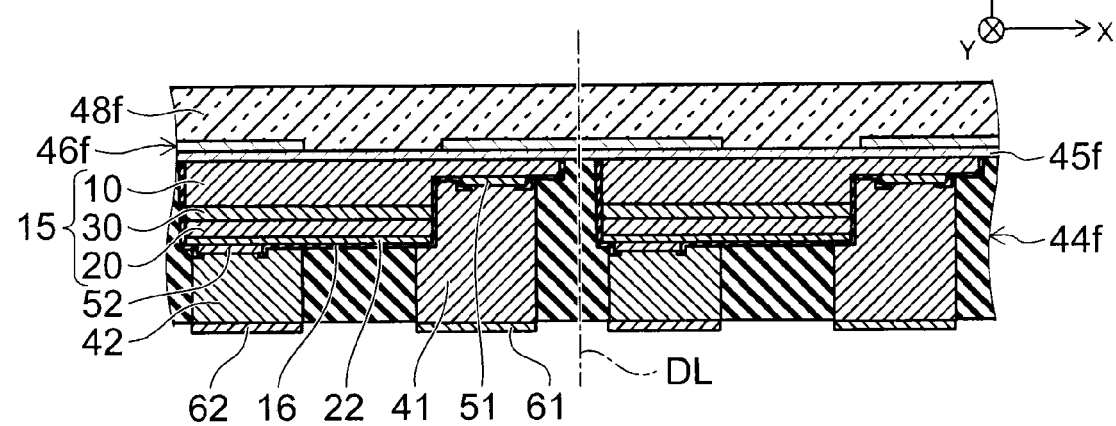

As illustrated in FIG. 10C, a wavelength conversion film 48f that will be the wavelength conversion layer 48 is formed on the translucent film 46f. A spin coating method, for example, may be used in the formation of the wavelength conversion film 48f. In the example, the film thickness of the translucent film 46f is 5 µm, and therefore, the wavelength conversion film 48f can be easily formed having a uniform film thickness using the spin coating method. By this, after the wavelength conversion film 48f is formed, there is no need to flatten the surface of the wavelength conversion film 48f using grinding or the like. By this, manufacturing steps can be simplified for the semiconductor light emitting device 120.

The resin film 44f is cut along a dicing line DL. In other words, the resin film 44f is cut between each of the plurality of light emitting units 15. By this, the plurality of light emitting units 15 is separated. By this, the sealing unit 44 is formed from the resin film 44f, the buffer layer 45 is formed from the buffer film 45f, the translucent layer 46 is formed from the translucent film 46f, and the wavelength conversion layer 48 is formed from the wavelength conversion film 48f.

According to the above, the semiconductor light emitting device 120 is completed. As a result, the semiconductor light emitting device 120 that suppresses chromaticity deviation is manufactured.

According to the embodiment, a semiconductor light emitting device that suppresses chromaticity deviation is provided.

Note that in this specification, the term, "nitride semiconductor" includes semiconductors of all compositions wherein composition proportions of x, y, and z in the formula $B_xIn_yAl_zGa_{1-x-y-z}N$ fall within the respective ranges of $0 \le x \le 1$, $0 \le y \le 1$, $0 \le z \le 1$, and $x+y+z \le 1$. Furthermore, with the formula described above, "nitride semiconductors" shall also be understood to include semiconductors further including group V elements other than N (nitrogen), semiconductors further including various elements added to control various physical properties such as conductivity type and the like, and semiconductors further including various elements that are included unintentionally.

In this specification, "perpendicular" and "parallel" are not used to mean perpendicular and parallel in their narrowest sense, but rather substantially perpendicular or parallel so as to take factors into account such as variations in manufacturing processes and the like.

Embodiments of the invention with reference to examples were described above. However, the embodiments of the invention are not limited to these examples. In regard to the specific configuration of constituents included in the semiconductor light emitting device, such as, first semiconductor layers, light emitting layers, second semiconductor layers, first conductive pillars, second conductive pillars, sealing units, translucent layers, wavelength conversion layers, first resin portions, first phosphor particles, second resin portions, second phosphor particles, and the like, as long as the invention is implemented in a similar manner and a similar effect is obtained by a person skilled in the art appropriately selecting from a known range, it is considered to be contained within the scope of the invention.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
a light emitting unit including a first semiconductor layer, a light emitting layer, and a second semiconductor layer, the first semiconductor layer having a first conductivity type and having a first major surface and a second major surface, the first major surface having a first portion and a second portion, the second major surface opposed the first major surface and having a third portion and a fourth portion provided around the third portion, the light emitting layer provided on the first portion, the second semiconductor layer having a second conductivity type and provided on the light emitting layer;
a first conductive pillar provided on the second portion, extending along a first direction perpendicular to the first major surface, having a side face extending along the first direction, and electrically connected to the first semiconductor layer;
a second conductive pillar provided on the second semiconductor layer, extending along the first direction, having a side face extending along the first direction, and electrically connected to the second semiconductor layer;
a sealing unit covering the side face of the first conductive pillar and the side face of the second conductive pillar;
a translucent layer having translucency and provided on the fourth portion; and
a wavelength conversion layer provided on the third portion and on the translucent layer, absorbing at least a part of a first light emitted from the light emitting layer, and emitting a second light having a peak wavelength different from the peak wavelength of the first light.

2. The device according to claim 1, wherein the translucent layer has a side face intersecting with a plane being parallel to the second major surface, and
the side face of the translucent layer is not covered by the wavelength conversion layer.

3. The device according to claim 2, wherein the peak wavelength of a third light emitted from the side face of the translucent layer is shorter than the peak wavelength of the second light.

4. The device according to claim 1, wherein a length of the third portion along a second direction perpendicular to the first direction is not less than 10% and not more than 60% of a length of the wavelength conversion layer along the second direction.

5. The device according to claim 1, wherein a thickness along the first direction of the translucent layer is not less than 5% and not more than 20% of a geometric average of a length of the wavelength conversion layer along the second direction perpendicular to the first direction and a length of the wavelength conversion layer along a third direction perpendicular to the first direction and the second direction.

6. The device according to claim 1, wherein a refractive index of the translucent layer is greater than a refractive index of the wavelength conversion layer.

7. The device according to claim 6, wherein a thickness along the first direction of the translucent layer is not less than 2% and not more than 10% of a geometric average of a length of the wavelength conversion layer along the second direction perpendicular to the first direction and a length of the wavelength conversion layer along the third direction perpendicular to the first direction and the second direction.

8. The device according to claim 6, wherein an absolute value of a difference between the refractive index of the translucent layer and the refractive index of the wavelength conversion layer is not less than 0.05 and not more than 0.17.

9. The device according to claim 1, wherein
the fourth portion is an annular shape that encompasses the third portion, and
the translucent layer is an annular shape.

10. The device according to claim 1, wherein the translucent layer has a top face parallel to the first major surface.

11. The device according to claim 1, wherein
the wavelength conversion layer includes a first resin portion having translucency and a plurality of first phosphor particles dispersed in the first resin portion,
the translucent layer includes a second resin portion having translucency and a plurality of second phosphor particles dispersed in the second resin portion, and
a concentration of the second phosphor particles included in the translucent layer is less than a concentration of the first phosphor particles included in the wavelength conversion layer.

12. The device according to claim 11, wherein the second resin portion includes the same material as the material included in the first resin portion.

13. The device according to claim 11, wherein the second phosphor particles include the same material as the material included in the first phosphor particles.

14. The device according to claim 1 further comprising a reflective layer provided between the second semiconductor layer and the sealing unit, wherein
a reflectance of the reflective layer is greater than a reflectance of the second semiconductor layer.

15. The device according to claim 1 further comprising a first electrode provided between the first semiconductor layer and the first conductive pillar, and
a second electrode provided between the second semiconductor layer and the second conductive pillar.

16. The device according to claim 1, wherein
the light emitting unit has a side face intersecting with a plane being parallel to the first major surface, and
the sealing unit further covers the side face of the light emitting unit.

17. The device according to claim 1 further comprising an insulating layer provided between the light emitting unit and the sealing unit.

18. The device according to claim 1 further comprising an intermediate layer having light transmittivity, provided between the second major surface and the translucent layer, and provided between the second major surface and the wavelength conversion layer.

19. The device according to claim 1, wherein
the fourth portion is provided in plurality,
the fourth portion provided in plurality is disposed around the third portion,
the translucent layer is provided in plurality, and
the translucent layer provided in plurality is provided on each of the fourth portions.

20. The device according to claim 1, wherein the sealing unit includes resin.

* * * * *